US007005897B2

(12) United States Patent
Lim

(10) Patent No.: US 7,005,897 B2
(45) Date of Patent: Feb. 28, 2006

(54) OUTPUT CIRCUIT

(75) Inventor: Yang Kyu Lim, Seoul (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 109 days.

(21) Appl. No.: 10/738,933

(22) Filed: Dec. 17, 2003

(65) Prior Publication Data

US 2004/0239382 A1   Dec. 2, 2004

(30) Foreign Application Priority Data

May 28, 2003   (KR) ...................... 10-2003-0034129

(51) Int. Cl.
*H03B 1/00*   (2006.01)

(52) U.S. Cl. ......................... 327/112; 327/391; 326/83

(58) Field of Classification Search ........ 327/108–112, 327/170, 379, 389, 391, 333, 374, 376, 377, 327/544; 326/26, 27, 82, 83, 68, 80, 81, 326/56–58
See application file for complete search history.

(56) References Cited

U.S. PATENT DOCUMENTS 6,166,561 A *  12/2000  Fifield et al. .................. 326/57
6,720,802 B1 *  4/2004  Cho ............................ 327/108

\* cited by examiner

*Primary Examiner*—Long Nguyen
(74) *Attorney, Agent, or Firm*—Marshall, Gerstein & Borun LLP

(57) ABSTRACT

The present invention relates to an output circuit. A first external power is supplied to be used as a second external power in a normal operating mode, an the supply of the power is shut off and an output driver is made to have a HIGH impedance state in a deep power down mode, by a control signal that is applied as different potentials in the normal operating mode and the deep power down mode. Therefore, it is possible to prevent consumption of internal current and introduction of a signal from the outside through a DQ terminal.

14 Claims, 2 Drawing Sheets

OUTPUT CIRCUIT

BACKGROUND

1. Field of the Invention

The present invention relates to an output circuit and, more particularly, to an output circuit that can prevent consumption of internal current and introduction of a signal from the outside through a DQ terminal, in such a manner that in a normal operating mode, a first external power is supplied to be used as a second external power, and in a deep power down mode, the supply of the power is shut off and an output driver is made to have a HIGH impedance state, by means of a power bar signal that is applied as a LOW state in the normal operating mode and applied as a HIGH state in the deep power down mode.

2. Discussion of Related Art

As one method for minimizing current consumption in a semiconductor device, a deep power down mode is employed. The deep power down mode is one for shutting off all the internal power to eliminate current flowing therein in order to reduce current consumption. In particular, a semiconductor device such as a pseudo SRAM has both the internal power and the external power used in the output circuit, etc. The conventional output circuit will now be described with reference to FIG. 1.

FIG. 1 is a circuit diagram illustrating the output circuit that is applicable to the semiconductor device such as the conventional pseudo SRAM.

A first inverter I11 inverts a global input/output signal (GIO) and a second inverter I12 inverts an output enable signal (OE). A NOR gate 11 performs a NOR operation for the output signal of the first inverter I11 and the output signal of the second inverter I12 to control the potential of a first node Q11. A first level shifter 12 outputs the potential of an external power (Vextq) or a ground potential depending on the level of the output signal of the NOR gate 11. A fourth inverter I14 inverts the output of the first level shifter 12. A seventh PMOS transistor P17 connected between the external power (Vextq) and a DQ terminal DQ is driven by the output signal of the fourth inverter I14.

A NAND gate 13 performs a NAND operation for the output signal of the first inverter I11 and the output enable signal (OE) to control the potential of a fifth node Q15. A second level shifter 14 outputs the potential of the external power (Vextq) or the ground potential depending on the level of the output signal of the NAND gate 13. A sixth inverter I16 inverts the output of the second level shifter 14. A seventh NMOS transistor N17 connected between the DQ terminal DQ and the ground terminal Vss is driven by the output signal of the sixth inverter I16.

The conventional output circuit constructed above is enabled to output the global input/output signal (GIO) to the DQ terminal DQ if the output enable signal (OE) is applied as a HIGH state. The operation of the conventional output circuit when the global input/output signal (GIO) is applied as the HIGH state may be described as follows:

The first inverter I11 inverts the global input/output signal (GIO) inputted as the HIGH state to output a signal of the LOW state. The second inverter I12 inverts the output enable signal (OE) inputted as the HIGH state to output a signal of the LOW state. The NOR gate 11 uses the output signal of the first inverter I11 that is the LOW state and the output signal of the second inverter I12 that is the LOW state to output a signal of the HIGH state. The first level shifter 12 outputs a signal of the HIGH state, i.e., a signal keeping the potential of the external power (Vextq), depending on the output signal of the NOR gate 11 that is the HIGH state. The output signal of the first level shifter 12 that is the HIGH state is inverted to the LOW state through the fourth inverter I14, so that the fourth node Q14 keeps the LOW state.

Meanwhile, the NAND gate 13 performs a NAND operation for the output signal of the first inverter I11 that keeps a LOW state and the output enable signal (OE) inputted as a HIGH state to output a signal of a HIGH state. The second level shifter 14 outputs a signal of the HIGH state, i.e., a signal keeping the potential of the external power (Vextq), depending on the output signal of the NAND gate 13 that keeps the HIGH state. The output signal of the second level shifter 14 that is the HIGH state is inverted to the LOW state through the sixth inverter I16, so that the eighth node Q18 keeps the LOW state.

Therefore, the seventh PMOS transistor P17 is turned on by the potential of the fourth node Q14 that keeps the LOW state. The seventh NMOS transistor N17 is turned off by the potential of the eighth node Q18 that keeps the LOW state. The external power (Vextq) is thus outputted to the DQ terminal DQ.

Since the conventional output circuit operated and constructed as above uses the external power intact, however, a large amount of current is consumed although the internal power is shut off in the deep power down mode. Specially, the first and second level shifters output the external power depending on the internal power. If the internal power is shut off, the first and second level shifters become floated. In this case, since current flows from the external power to the ground terminal, current is consumed. For this reason, it does not make effective use of the characteristic of the deep power down mode. Furthermore, if the internal power is shut off, the seventh PMOS transistor and the seventh NMOS transistor do not operate. As the signal may be introduced from the outside to the inside through the DQ terminal, however, current is internally consumed.

SUMMARY OF THE INVENTION

The present invention is contrived to solve the aforementioned problems. The present invention is directed to an output circuit capable of preventing current consumption in a deep power down mode of a semiconductor device. In addition, the present invention is to provide an output circuit capable of preventing current consumption by not allowing a signal to be introduced from the outside to the inside through a DQ terminal.

According to one aspect of the present, there is provided an output circuit, including a first switch for supplying a first external power to be used as a second external power or shutting off the supply of the power, according to a control signal, an output buffer for outputting a signal keeping the potential of the second external power or a ground potential depending on an input signal, an enable signal and the control signal, an output driver for outputting a signal keeping the potential of the second external power or the ground potential according to the output signal of the output butter, a second switch for allowing one of input terminals of the output driver to have the potential of the first external power according to the control signal, and a third switch for allowing the other of the input terminals of the output driver to have the ground potential according to the control signal.

BRIEF DESCRIPTION OF THE DRAWINGS

The above and other objects, features and advantages of the present invention will become apparent from the following description of preferred embodiments given in conjunction with the accompanying drawings, in which.

DETAILED DESCRIPTION OF PREFERRED EMBODIMENTS

The present invention will now be described in detail in connection with a preferred embodiment with reference to the accompanying drawing.

Figure 1:
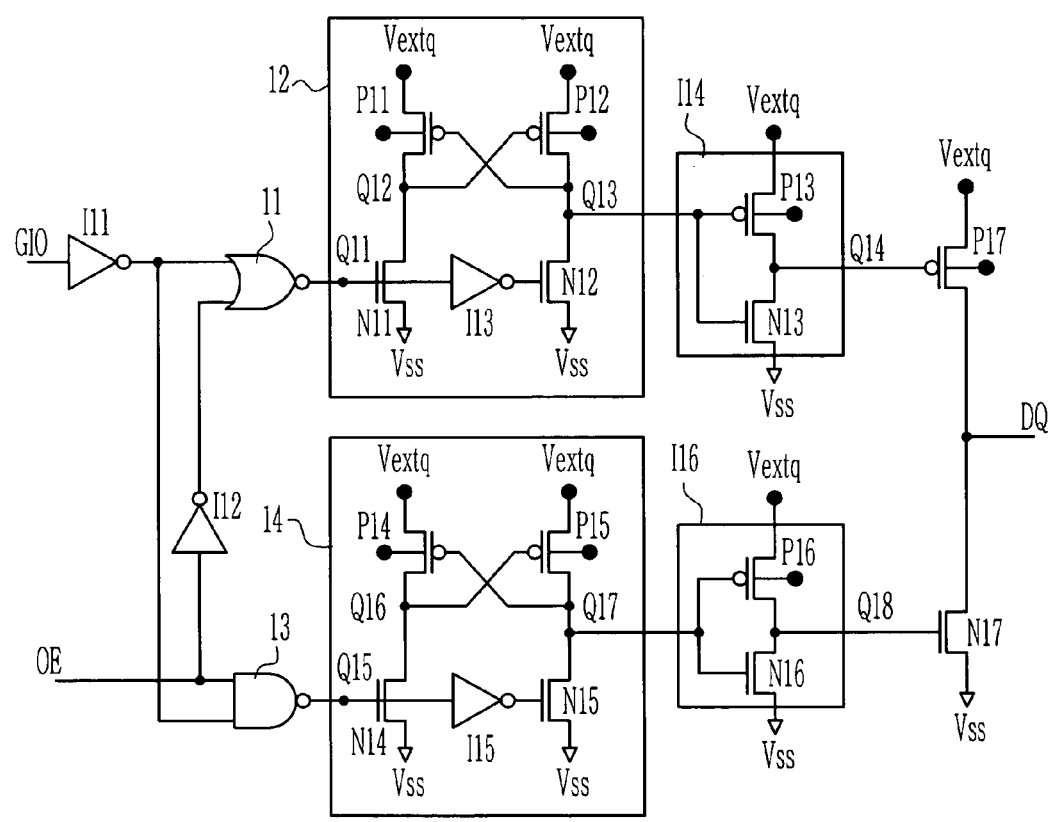
FIG. 1 is a circuit diagram illustrating a conventional output circuit.
Figure 2:
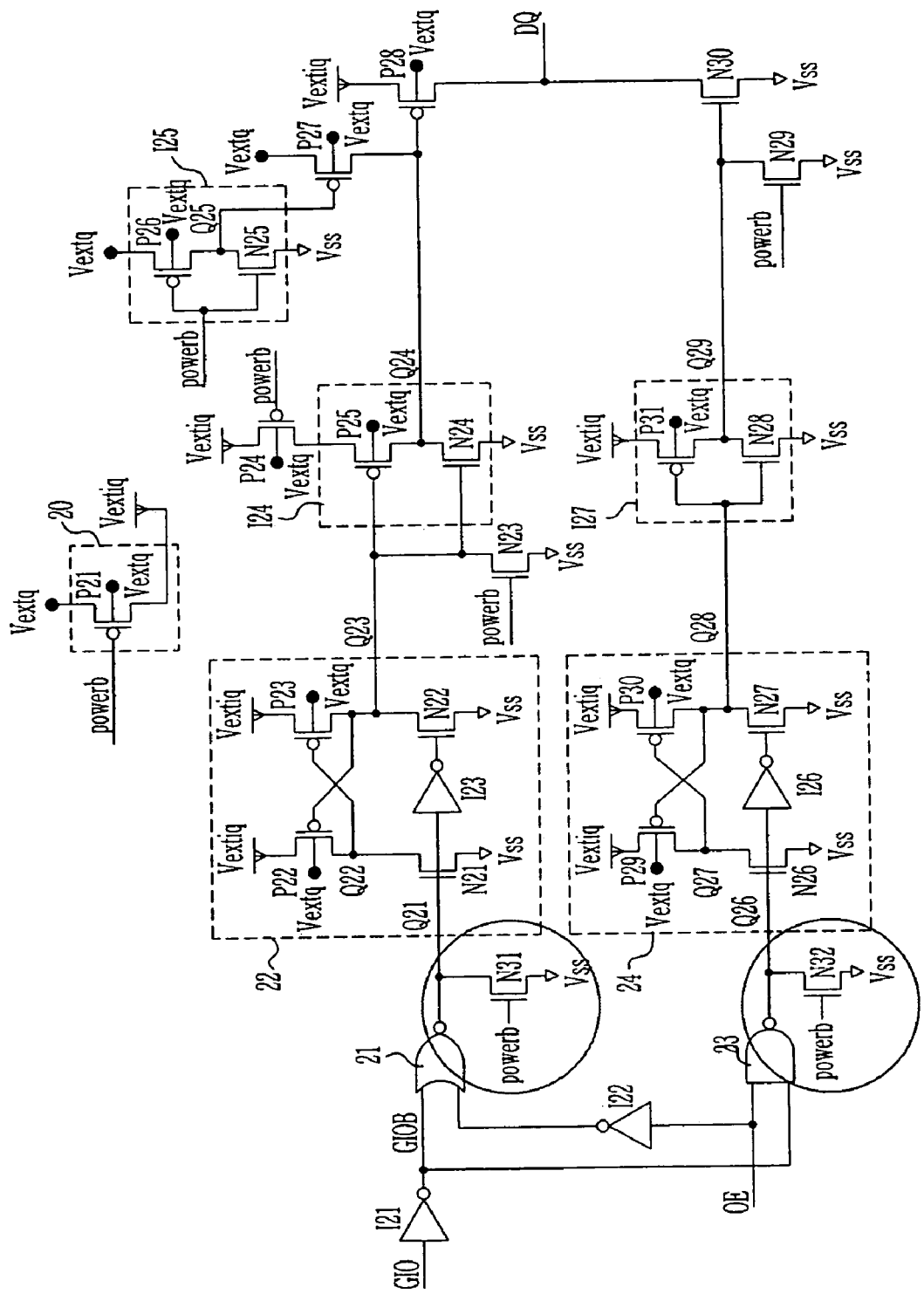
FIG. 2 is a circuit diagram illustrating an output circuit according to a preferred embodiment of the present invention.

FIG. 2 is a circuit diagram illustrating an output circuit that is applied to a semiconductor device such as a pseudo SRAM according to a preferred embodiment of the present invention.

A first PMOS transistor P21 is driven by a power bar signal (powerb) to supply a first external power (Vextq), which is used as a second external power (Vextiq) or serves as a switch 20 for shutting off the supply of the power. At this time, the power bar signal (powerb) is a signal that is applied as a LOW state in a normal operating mode and as a HIGH, signal in a deep power down mode, which is generated by an external command.

A first inverter I21 inverts a global input/output signal (GIO) and a second inverter I22 inverts an output enable signal (OE). A NOR gate 21 performs a NOR operation for the output signal of the first inverter I21 and the output signal of the second inverter I22 to control the potential of a first node Q21. A first level shifter 22 outputs the potential of the second external power (Vextiq) or a ground potential depending on the level of the output signal of the NOR gate 21. A third NMOS transistor N23 driven by the power bar signal (powerb) is connected between a third node Q23 being an output terminal of the first level shifter 22 and the ground terminal Vss. Meanwhile, the first level shifter 22 includes a second PMOS transistor P22 connected between the second external power (Vextiq) and the second node Q22 and driven by the potential of the third node Q23, a first NMOS transistor N21 connected between the second node Q22 and the ground terminal Vss and driven by the output signal of the NOR gate 21, a third PMOS transistor P23 connected between the second external power (Vextiq) and the third node Q23 and driven by the potential of the second node Q22, and a second NMOS transistor N22 connected between the third node Q23 and the ground terminal Vss and driven by the output signal of a third inverter I23 for inverting the output signal of the NOR gate 21. Furthermore, the third NMOS transistor N23 driven by the power bar signal (powerb) is connected between the third node Q23 and the ground terminal Vss. A fourth PMOS transistor P24 and a fourth inverter I24 are connected between the second external power (Vextiq) and the ground terminal Vss. The fourth PMOS transistor P24 is driven by the power bar signal (powerb). The fourth inverter I24 includes a fifth PMOS transistor P25 and a fourth NMOS transistor N24 and inverts the output of the first level shifter 22 to control the potential of the fourth node Q24. A fifth inverter I25 includes a sixth PMOS transistor P26 and a fifth NMOS transistor N25, which are serially connected between the first external power (Vextq) and the ground terminal Vss, and inverts the power bar signal (powerb) to control the potential of the fifth node Q25. A seventh PMOS transistor P27 connected between the first external power (Vextq) and the fourth node Q24 is driven by the potential of the fifth node Q25. An eighth PMOS transistor P28 connected between the second external power (Vextiq) and the DQ terminal DQ is driven by the potential of the fourth node Q23.

A NAND gate 23 performs a NAND operation for the output signal of the first inverter I21 and the output enable signal (OE) to control the potential of a sixth node Q26. A second level shifter 24 outputs the potential of the second external power (Vextiq) or the ground potential (Vss) depending on the level of the output signal of the NAND gate 23. Meanwhile, the second level shifter 24 includes a ninth PMOS transistor P29 connected between the second external power (Vextiq) and a seventh node Q27 and driven by the potential of an eighth node Q28, a sixth NMOS transistor N26 connected between the seventh node Q27 and the ground terminal Vss and driven by the output signal of the NAND gate 23, a tenth PMOS transistor P30 connected between the second external power (Vextiq) and the eighth node Q28 and driven by the potential of the seventh node Q27, and a seventh NMOS transistor N27 connected between the eighth node Q28 and the ground terminal Vss and driven by the output signal of a sixth inverter I26 for inverting the output signal of the NAND gate 23. Further, a seventh inverter I27, consisting of an eleventh PMOS transistor P31 connected between the second external power (Vextiq) and a ninth node Q29 and an eighth NMOS transistor N28 connected between the ninth node Q29 and the ground terminal Vss, inverts the output of the second level shifter 24 to control the potential of the ninth node Q29. A ninth NMOS transistor N29 connected between the ninth node Q29 and the ground terminal Vss is driven by the power bar signal (powerb). A tenth NMOS transistor N30 connected between the DQ terminal DQ and the ground terminal Vss is driven by the potential of the ninth node Q29.

Meanwhile, the first external power (Vextq) is applied to the bulk of each of the first to eleventh PMOS transistors P21 to P31.

The output circuit constructed above according to the present invention outputs the global input/output signal (GIO) to the DQ terminal DQ when the output enable signal (OE) is applied as a HIGH state in the normal operating mode. The operation of the output circuit when the global input/output signal (GIO) is applied as the HIGH state will now be described below.

If the power bar signal (powerb) is applied as a LOW state in the normal operating mode, the first PMOS transistor P21 is turned on, so that the first external power (Vextq) is supplied and is thus used as the second external power (Vextiq).

The first inverter I21 inverts the global input/output signal (GIO) inputted as the HIGH state to output a signal of the LOW state. The second inverter I22 inverts the output enable signal (OE) inputted as the HIGH state to output a signal of the LOW state. The NOR gate 21 performs a NOR operation for the output signal of the first inverter I21 that is the LOW state and the output signal of the second inverter I22 that is the LOW state to output a signal of a HIGH state. The first level shifter 22 outputs a signal that keeps the potential of the second external power (Vextiq) supplied from the first external power (Vextq) through the first PMOS transistor P21 depending on the level of the output signal of the NOR gate 21 that is a HIGH state. Since the third NMOS transistor N23 is turned off and the fourth PMOS transistor P24 is turned on by the power bar signal (powerb) applied as the LOW state, the output signal of the first level shifter 22 that keeps the HIGH state is inverted to a LOW state through the fourth inverter I24 and the fourth node Q24 thus keeps the LOW state. Furthermore, the power bar signal (powerb)

applied as the LOW state is inverted to the HIGH state by means of the fifth inverter I25 and the fifth node Q25 keeps the potential of the first external power (Vextq). The seventh PMOS transistor P27 is turned off by the potential of the fifth node Q25 that keeps the potential of the first external power (Vextq). Therefore, the fourth node Q24 keeps a LOW state.

Meanwhile, the NAND gate 23 performs a NAND operation for the output signal of the first inverter I21 inputted as a LOW state and the output enable signal (OE) applied as a HIGH state to output a signal of a HIGH state. The second level shifter 24 outputs a signal that keeps the potential of the second external power (Vextiq) supplied from the first external power (Vextq) through the first PMOS transistor P21 depending on the level of the output signal of the NAND gate 23 that keeps a HIGH state. The output signal of the second level shifter 24 that keeps a HIGH state is inverted to a LOW state through the seventh inverter I27 and the ninth node Q29 thus keeps the LOW state. At this time, the ninth NMOS transistor N29 is turned off by the power bar signal (powerb) applied as the LOW state.

Accordingly, the eighth PMOS transistor P28 is turned on by the potential of the fourth node Q24 that is in the LOW state, and the tenth NMOS transistor N30 is turned off by the potential of the ninth node Q29 that is in the LOW state. The second external power (Vextiq) is thus outputted to the DQ terminal DQ.

If the power bar signal (powerb) is applied as the HIGH state in the deep power down mode, the first PMOS transistor P21 is turned off and the first external power (Vextq) is thus not supplied as the second external power (Vextiq). Therefore, the first and second level shifters 22 and 24 are floated. Further, the third NMOS transistor N23 is turned on and the third node Q23 keeps the LOW state. As the fourth PMOS transistor P24 is turned off, the second external power (Vextiq) is not supplied and the fourth inverter I24 does not operate. The fourth node Q24 is therefore floated. At this time, the power bar signal (powerb) applied as the HIGH state is inverted to the LOW state by means of the fifth inverter I25. Thus, the fifth node Q25 keeps the LOW state. The seventh PMOS transistor P27 is turned on by the potential of the fifth node Q25 keeping the LOW state and the first external power (Vextq) is supplied to the fourth node Q24. Accordingly, the fourth node Q24 keeps the HIGH state and the eighth PMOS transistor P28 is thus turned off.

Furthermore, as the ninth NMOS transistor N29 is turned on by the power bar signal (powerb) applied as the HIGH state, the ninth node Q29 keeps the LOW state and the tenth NMOS transistor N30 is turned off accordingly.

As above, if the power bar signal (powerb) is applied as the HIGH state in the deep power down mode, the eighth PMOS transistor P28 and the tenth NMOS transistor N30 become a HIGH impedance state. Therefore, a signal is not introduced into the inside from the outside through the DQ terminal DQ.

Meanwhile, although the potentials of the third node Q23, the fourth node Q24 and the ninth node Q29 are controlled by the power bar signal (powerb) in the present invention by way of an example, the NMOS transistor N31 and N32 may be constructed to control the potential of the first and sixth nodes Q21 and Q26 at the front of the first and second level shifters 22 and 24.

According to the present invention as described above, by a power bar signal that is applied as a LOW state in a normal operating mode and applied as a HIGH state in a deep power down mode, a first external power is supplied to be used as a second external power in the normal operating mode, and the supply of the power is shut off and an output driver is made to keep a HIGH impedance state in a deep power down mode. Therefore, the present invention has advantages that it can prevent consumption of internal current and introduction of the signal from the outside through a DQ terminal.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. An output circuit, comprising:
    a first switch for supplying a first external power to be used as a second external power or shutting off the supply of the first external power, according to a control signal;
    an output buffer for outputting a signal having a potential of the second external power or a ground potential, depending on an input signal, an enable signal and the control signal;
    an output driver for outputting a signal having the potential of the second external power or the ground potential depending on the output signal of the output buffer;
    a second switch for allowing one of input terminals of the output driver to have the potential of the first external power according to the control signal; and
    a third switch for allowing the other of the input terminals of the output driver to have the ground potential according to the control signal.

2. The output circuit as claimed in claim 1, wherein the control signal is a signal that is applied as different potential states in a normal operating mode and a deep power down mode.

3. The output circuit as claimed in claim 1, wherein the first switch is a PMOS transistor that is driven according to the control signal.

4. The output circuit as claimed in claim 1, wherein the output buffer comprises:
    a first input means for receiving the input signal and the enable signal;
    a second input means for receiving the input signal and the enable signal;
    a first driving means for outputting the potential of the second external power or the ground potential to a first node, according to the control signal and an output signal of the first input means; and
    a second driving means for outputting the potential of the second external power or the ground potential to a second node, according to the control signal and an output signal of the second input means.

5. The output circuit as claimed in claim 4, wherein the first input means comprises:
    a first inverter for inverting the input signal;
    a second inverter for inverting the enable signal; and
    a NOR gate for performing a NOR operation of the output signal of the first inverter and the output signal of the second inverter.

6. The output circuit as claimed in claim 4, wherein the second input means comprises:
    an inverter for inverting the input signal; and
    a NAND gate for performing a NAND operation of the output signal of the inverter and the enable signal.

7. The output circuit as claimed in claim 4, wherein the first driving means comprises:

a level shifter for outputting an output signal having the potential of the second external power or the ground potential according to the output signal of the first input means;

an NMOS transistor connected between the output terminal of the first level shifter and the ground potential and driven by the control signal;

a PMOS transistor for supplying the second external power according to the control signal; and an inverter for outputting the potential of the second external power supplied through the PMOS transistor or the ground potential, according to the output signal of the level shifter.

8. The output circuit as claimed in claim 4, wherein the second driving means comprises:

a level shifter for outputting the potential of the second external power or the ground potential according to the output signal of the second input means; and an inverter for inverting the output signal of the level shifter to output the potential of the second external power or the ground potential.

9. The output circuit as claimed in claim 4, further comprising an NMOS transistor for keeping the potential of an input terminal of the first driving means to be the ground potential, according to the control signal.

10. The output circuit as claimed in claim 4, further comprising an NMOS transistor for keeping the potential of the input terminal of the second driving means to be the ground potential, according to the control signal.

11. The output circuit as claimed in claim 1, wherein the second switch comprises:

an inverter for outputting an output signal having the potential of the first external power or the ground potential according to the control signal; and a PMOS transistor for supplying the first external power to a first node depending on the output signal of the inverter.

12. The output circuit as claimed in claim 1, wherein the third switch is an NMOS transistor connected between a second node and the ground potential and driven by the control signal.

13. An output circuit, comprising:

a first switch for supplying a first external power to be used as a second external power in a normal operating mode and shutting off the supply of the first external power in a deep power down mode, according to a control signal;

an output buffer for outputting a signal having a potential of the second external power or a ground potential according to an enable signal and the control signal in the normal operating mode, wherein the output buffer is floated in the deep power down mode;

an output driver for outputting a signal having the potential of the second external power or the ground potential according to the output signal of the output buffer in the normal operating mode;

a second switch for allowing one of input terminals of the output driver to have the potential of the first external power in the deep power down mode; and a third switch for allowing the other of the input terminals of the output driver to have the ground potential in the deep power down mode.

14. An output circuit, comprising:

a first switch for supplying a first external power to be used as a second external power in a normal operating mode and shutting off the supply of the first external power in a deep power down mode, according to a control signal;

a first input means for receiving a global input/output signal and an output enable signal;

a second input means for receiving the global input/output signal and the output enable signal;

a first driving means for outputting a potential of the second external power supplied through the first switch or the ground potential to a first node according to an output signal of the first input means in the normal operating mode, wherein the first driving means is floated in the deep power down mode;

a second driving means for outputting the potential of the second external power supplied through the first switch or the ground potential to a second node according to an output signal of the second input means in the normal operating mode, wherein the second driving means is floated in the deep power down mode;

a second switch for supplying the first external power to the first node according to the control signal in the deep power down mode;

a third switch for controlling the potential of the second node to become the ground potential according to the control signal in the deep power down mode; and an output driver for outputting the potential of the second external power supplied through the first switch or the ground potential to an output terminal depending on the potential of the first node and the potential of the second node in the normal operating mode.

* * * * *

UNITED STATES PATENT AND TRADEMARK OFFICE
CERTIFICATE OF CORRECTION

PATENT NO. : 7,005,897 B2  
APPLICATION NO. : 10/738933  
DATED : February 28, 2006  
INVENTOR(S) : Yang K. Lim Page 1 of 1

It is certified that error appears in the above-identified patent and that said Letters Patent is hereby corrected as shown below:

On the Title Page

Item (57), line 3, "an the supply" should be -- and the supply --.

Signed and Sealed this
Tenth Day of May, 2011

David J. Kappos
*Director of the United States Patent and Trademark Office*